(12) United States Patent
Clary

(10) Patent No.: US 6,264,505 B1
(45) Date of Patent: Jul. 24, 2001

(54) INTEGRATED SHIELDED CABLE

(75) Inventor: Scott Alan Clary, Longwood, FL (US)

(73) Assignee: Lockheed Martin Corporation, Bethesda, MD (US)

(*) Notice: Subject to any disclaimer, the term of this patent is extended or adjusted under 35 U.S.C. 154(b) by 0 days.

(21) Appl. No.: 09/516,145

(22) Filed: Mar. 1, 2000

(51) Int. Cl.⁷ .................................................. H01R 13/40
(52) U.S. Cl. ......................................... 439/610; 174/151
(58) Field of Search ................................ 439/610, 98, 99, 439/607, 939, 95, 101, 108, 609, 931, 339, 320, 323, 544; 174/35 C, 35 R, 18, 151

(56) References Cited

U.S. PATENT DOCUMENTS

| | | |
|---|---|---|
| 2,490,596 | 12/1949 | Morris . |
| 3,268,650 | 8/1966 | Hepker . |
| 4,625,072 | 11/1986 | VanBrunt . |
| 4,855,533 | 8/1989 | Meyers Swantée . |
| 5,012,042 | 4/1991 | Summach . |
| 5,083,929 | * 1/1992 | Dalton ...................................... 439/98 |
| 5,170,008 | 12/1992 | Evans et al. . |
| 5,399,808 | 3/1995 | Carter et al. . |
| 5,404,276 | 4/1995 | Hansson et al. . |
| 5,410,102 | 4/1995 | Guiol et al. . |
| 5,890,929 | * 4/1999 | Mills et al. ............................ 439/610 |

FOREIGN PATENT DOCUMENTS

| | | | |
|---|---|---|---|
| 3311651 | * 4/1984 | (DE) | ...................................... 439/610 |
| 5327266 | * 10/1993 | (JP) | ...................................... 439/610 |
| 5170008 | * 12/1992 | (US) | ..................................... 174/35 C |

* cited by examiner

*Primary Examiner*—Brian Sircus
*Assistant Examiner*—J. F. Duverne
(74) *Attorney, Agent, or Firm*—Burns, Doane, Swecker & Mathis, LLP

(57) ABSTRACT

The present invention is directed to a common integrated shielded cable interface which constitutes a cost-effective alternative to using expensive size/type dependent connector backshells and metal shell connectors to provide EMI shielding for single and multiconductor electrical cables that is fundamentally mechanical in nature.

12 Claims, 3 Drawing Sheets

INTEGRATED SHIELDED CABLE

BACKGROUND OF THE INVENTION

1. Field of the Invention

The present invention relates generally to a shielded cable interface plate and associated cable bushings and, more specifically, to a mechanical labyrinth that provides efficient shielding from electromagnetic interference (EMI).

2. Description of Related Art

Electromagnetic interference (EMI) can result when, for example, multiple electrical circuits are located in close proximity to each other. Generally, metal connector backshells are used in conjunction with metal shell connectors and cable shield braid to shield circuits, electrical wires and cables that are sensitive to EMI. However, metal connector backshells are expensive and time consuming to implement because they must be designed or procured specifically for a particular size and type of metal shell connector. Additionally, metal shell connectors themselves are inherently expensive and time consuming to implement when compared to their commercially available plastic equivalents.

Other types of EMI shielding rely on the establishment of a continuous electrical shield to prevent EMI from degrading the effectiveness of circuitry. For example, U.S. Pat. No. 5,170,008 describes an enclosure structure having an electrically conductive grommet and a two-piece interface plate. The grommet provides a conductive elastomer connection that surrounds a stripped portion of an external cable shield. The cable is inserted through the central passage of the grommet, and the grommet is fit into a U-shaped opening in one-piece of the two-piece interface plate. The open side of the U-shaped opening is closed by the other half of the interface plate. A one-piece metal band within the grommet provides a direct low resistance path from the cable shield to the interface plate. The band forms to an outer groove of the grommet and the elasticity of the grommet holds the band in place. Thus, a continuous, contiguous and electrically conductive contact between the cable shield, the conductive grommet, the band, and the enclosure structure is used to provide EMI shielding.

U.S. Pat. No. 5,012,042 describes providing EMI shielding by mechanically fastening a cable shield to an enclosure. As with other known connector elements, uniform and consistent electrical contact between the cable shield and the enclosure is used to shield EMI.

It would be desirable to provide a shielded interface which is less expensive, less complex and therefore more cost effective to implement than conventional EMI shielding techniques used on electrical cables. Furthermore, it would be desirable to provide a shielded interface which is not dependent upon the connector type or size, such that it is more versatile.

SUMMARY OF THE INVENTION

The present invention is directed to a common integrated shielded cable interface which constitutes a cost-effective alternative to using expensive size/type dependent connector backshells and metal shell connectors to provide EMI shielding for single and multiconductor electrical cables that is fundamentally mechanical in nature.

In an exemplary embodiment of the present invention, a shielded connector assembly comprises a cable interface assembly for establishing an electromagnetic interference (EMI) shield for shielding an area, the shield being formed of multiple components assembled together with a joint between the components of the shield, the joint being susceptible to EMI; and a connector, electrically shielded by the cable interface assembly, for connecting a conductive wire to an electronic assembly, the components of the cable interface assembly further including: at least two interface plates mated at an interface for establishing the joint and at least one opening the joint being configured to reflect EMI away from the shielded area; and at least one cable bushing for receiving the conductive wire, mounted between the interface plates in the at least one opening.

In another exemplary embodiment of the present invention, a cable interface assembly for establishing an electromagnetic interference (EMI) shield for shielding an area, the shield being formed of multiple components assembled together with a joint between the components of the shield, the joint being susceptible to EMI, comprises: at least two interface plates mated at an interface for establishing the joint and at least one opening the joint being configured to reflect EMI away from the shielded area; and at least one cable bushing for receiving a conductive wire, mounted between the interface plates in the at least one opening.

BRIEF DESCRIPTION OF THE DRAWINGS

Other objects and advantages of the present invention will become more apparent from the following detailed description of preferred embodiments, when read in conjunction with the accompanying drawings wherein like elements have been represented by like reference numerals and wherein.

DETAILED DESCRIPTION OF THE INVENTION

Figure 1A:
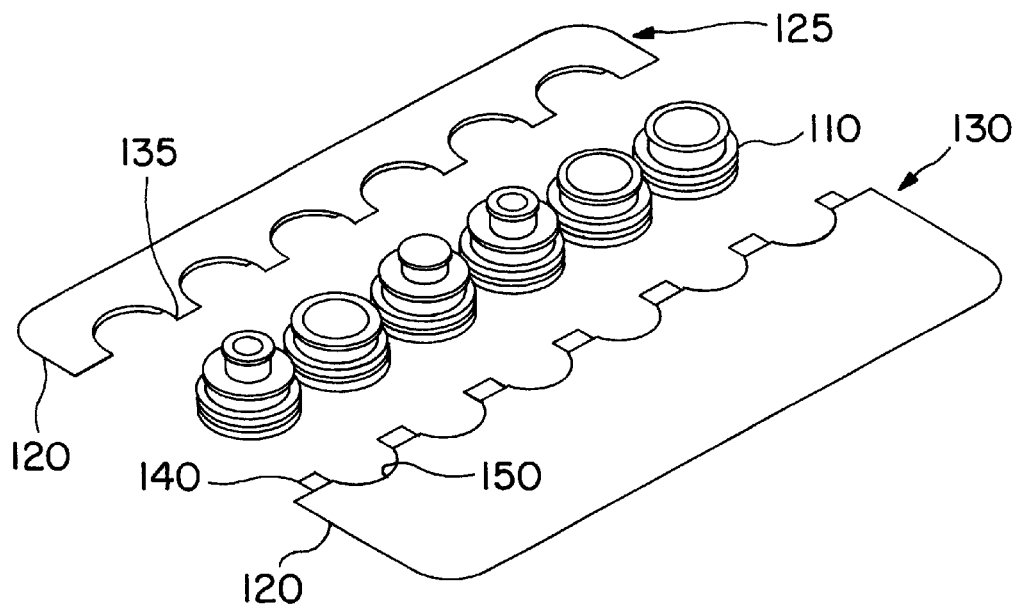
FIGS. 1A and 1B illustrate exploded top and bottom views of an interface assembly in accordance with an exemplary embodiment of the present invention.

FIG. 1A illustrates an exploded top view of an interface plate 120 configured in accordance with an exemplary embodiment of the present invention. The interface plate 120 establishes an electromagnetic interference shield for shielding an area. The interface plate 120 comprises a left half plate 125 and a right half plate 130 each having arcuate cutouts 150. When both the left half plate 125 and right half plate 130 are joined, a plurality of holes are formed by the cutouts 150 and provide space for a plurality of cable bushings 110. The left half plate 125 and the right half plate 130 are identical except that the left half plate 125 has an upper lip 135 and the right half plate 130 has a lower lip 140. Accordingly, when the left half plate 125 and right half plate 130 are joined, a lap joint is created between the holes for receiving and holding cable bushings 110. One skilled in the art will recognize that either the left half plate 125 or the right half plate 130 can have the upper lip as long as the other plate is equipped with the lower lip. Alternately, the upper/lower lips can be mixed among the two plates, provided that each upper lip mates with an opposing lower lip.

Figure 1B:
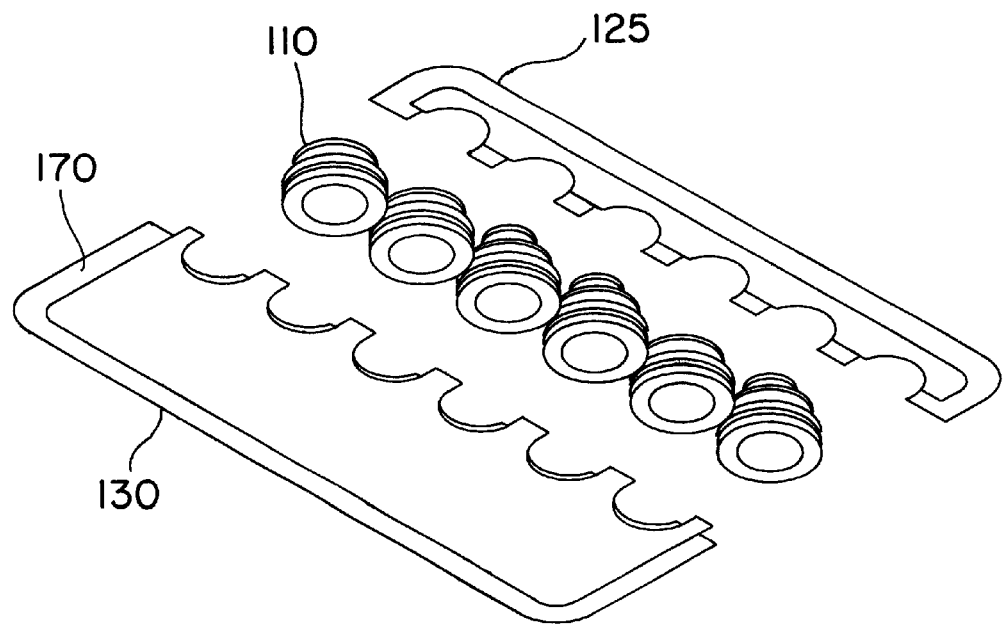

FIG. 1B shows a bottom view of the left and right half plates 125 and 130 of the interface plate 130, including a metal lip 170. The metal lip 170 is formed along the entire outer periphery of the interface plate 120 so that the interface plate 120 can mate with other devices (e.g., another housing cover or rack panel).

Both the cable bushing 110 and interface plate 120 can be made from any metal (e.g., aluminum), metallized plastic, or any other structural material that has desired EMI shielding characteristics. The cable bushing 110 can also be part of an electrical cable assembly, and be terminated to a cable braid shield in the same manner as conventional connector backshells.

Figure 2A:
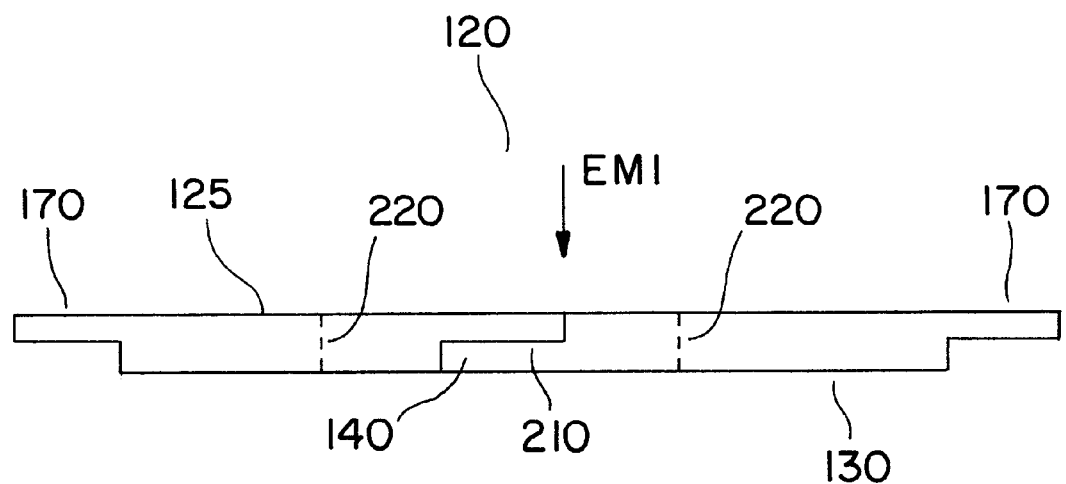
FIGS. 2A and 2B illustrate exemplary side views of the FIG. 1 interface assembly.

FIG. 2A illustrates a side view of the joined left and right half plates 125 and 130. The joining of the left half plate 125 and right half plate 130 results in a lap joint 210 which comprises at least two perpendicular surfaces to reflect EMI. The lap joint is series of mated surfaces formed by interfacing the left half plate 125 with the right half plate 130. The joint created at the interface of the left and right half plates is susceptible to EMI. However, in accordance with an exemplary embodiment of the present invention, the result of the lap joint 210 is essentially a series of roadblocks, e.g., a mechanical labyrinth, which reflects EMI so as to prevent EMI from penetrating entirely through the interface plate 120. The dashed lines 220 represent boundaries of holes in the interface plate 120 for the cable bushings 110.

Any EMI that exists on the outside of the interface plate 120 will penetrate the interface plate 120 at the joint between the left half plate 125 and the right half plate 130 and will also penetrate the plate at the joint between the plate 120 and the cable bushing 110. As illustrated in FIG. 2A, if the EMI existed at the joint between the plates of the two piece interface plate 120, it would enter the joint vertically. The interference would first encounter the upper portion of the lower lip 140 of the right half plate 130. At this point, much of the EMI will be reflected away from the plates. Any residual EMI will continue to follow horizontally along the lap joint 210 between the left and right half plates. However, as shown in FIG. 2A, this EMI will encounter a portion of the left half plate 125. Any remaining EMI will be reflected and will not pass through the remaining joint area. As a result, EMI is unable to penetrate through the entire interface plate 120 and the interface creates a path to reflect EMI in at least two orthogonal directions away from the interface.

Figure 2B:
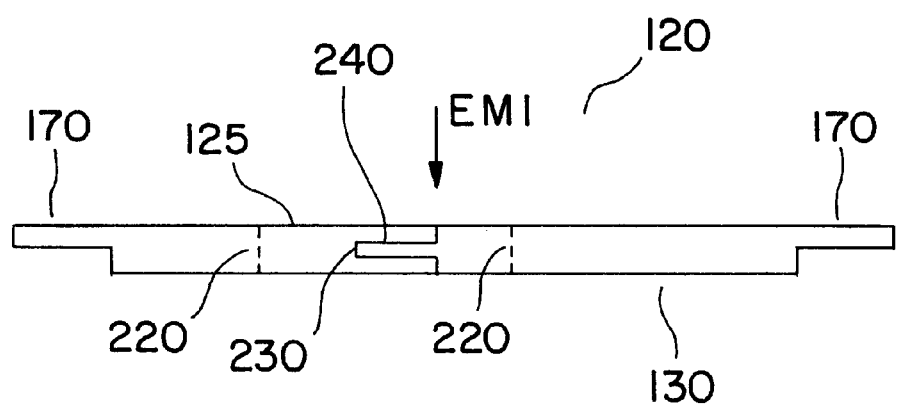

Alternately, as illustrated in FIG. 2B, the joint between the left half plate 125 and right half plate 130 can also be configured as a tongue-and-groove joint 230. Any EMI that exists on the outside of the interface plate 120 will penetrate the interface plate 120 at the joint between the left half plate 125 and the right half plate 130 and will also penetrate the plate at the joint between the plate 120 and the cable bushing 110 (illustrated in FIGS. 1 A and 1B). As illustrated in FIG. 2B, if the EMI existed at the joint between the plates of the two piece interface plate 120, it would enter the joint vertically. The interference would first encounter the upper portion of the tongue 240 of the right half plate 130. At this point, much of the EMI will be reflected away from the plates. Any residual EMI will continue to follow horizontally along the tongue and groove joint 230 between the left and right half plates. However, as shown in FIG. 2B, this EMI will encounter a portion of the left half plate 125. Any remaining EMI will be reflected and will not pass through the remaining joint area. As a result, EMI is unable to penetrate through the entire interface plate 120 and the interface creates a path to reflect EMI in at least two orthogonal directions away from the interface.

Figure 3:
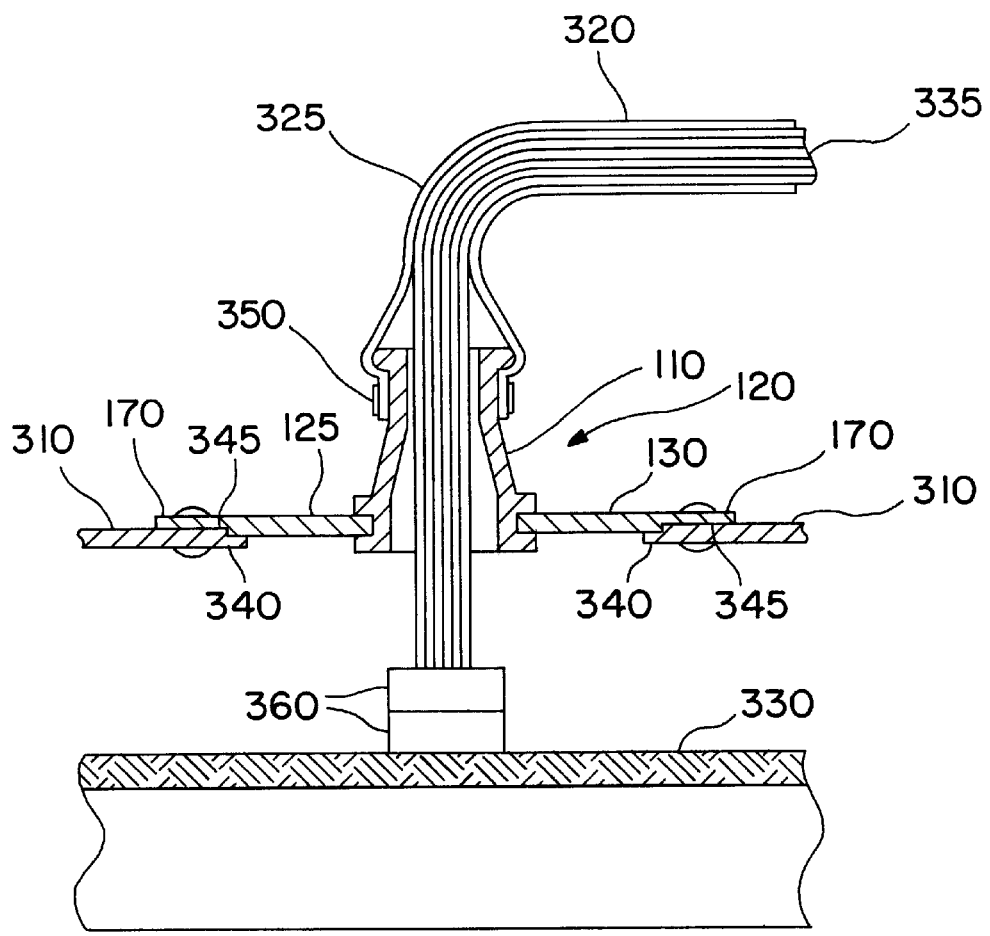
FIG. 3 illustrates a side view of the FIG. 1 interface assembly of the present invention used with a circuit cover, in accordance with an exemplary embodiment of the present invention.

FIG. 3 illustrates a cross sectional view of an interface plate 120 at the location of the bushing 110 and also shows the use of metal lip 170 to form a lap joint with a cover 310 used to protect an electronic assembly (i.e., a circuit board or circuit component) 330. A cable 320 is attached to a cable bushing 110 located in one of the available holes in the interface plate 120. Each cable 320 can contain a plurality of wires 335 that are connected to the electronic assembly 330 enclosed by the cover 310 using an inexpensive commercially available plastic connector 360. While connector 360 is shown connecting the wires to the electronic assembly, many other types of connections (e.g., solder joints, etc.) could also be employed. The cable 320 is protected from EMI along its length by a braid 325 which surrounds an outer diameter of the cable 320. The end of braid 325 can be secured to the cable bushing 110 using, for example, a band clamp 350 or any other attachment means.

In accordance with an exemplary embodiment of the present invention, the cover 310 contains a lower lip 340 which forms a lap joint 345 with the peripheral upper lip 170 of the interface plate 120. As discussed with respect to the left and right half plates 125 and 130 in FIG. 2, EMI is unable to penetrate the interface between the periphery of the interface plate 120 and the cover 310. If the EMI were to penetrate the lap joint 345 formed between the cover 310 and the interface plate 120, it would enter the joint horizontally. The EMI would first encounter a portion of the left half plate 125. At this point, much of the EMI will be reflected away from the left half plate 125. Any residual EMI would continue to follow along the joint between the cover 310 and the left half plate 125. However, this residual EMI would encounter the upper portion of the lower lip 340 of cover 310. The remaining EMI would thus be reflected and would not pass through the remaining joint area. As a result, EMI is unable to penetrate through the lap joint 345 connecting the interface plate 120 and the top cover 310. Similarly, EMI is unable to penetrate the joint created on the right of FIG. 3, between the right half plate 130 and the cover 310.

The interlocked left and right half plates 125 and 130 and the periphery of the interface plate 120 and the cover 310 provide adequate EMI shielding.

The interface plate 120 can, for example, be rigidly attached to a panel, box, or bulkhead using threaded fasteners, rivets, or conductive adhesives. When the interface plate 120 is employed with a circuit cover, as shown in FIG. 3, an efficient conduit is created for wires 320 which eliminates the requirement for specially made metal shell connectors and backshells. Instead, commonly used cable bushings 110 can be placed at the interface plate as illustrated in FIG. 3. The cable bushing 110 provides an efficient conduit for the wire within the cable to be run to the circuit board. At the electronic assembly 330, a commonly available connector 360 can be employed to connect the wires 320 to the electronic assembly. This significantly reduces the cost of building electronic assemblies, since special (i.e., application specific) metal connectors and backshells do not have to be procured or fabricated. The cable bushing 110 can be locked in place at the next-level assembly by the interface plate.

Like the joint between the left and right half plates, EMI would enter the joint between the cable bushing 110 and interface plate 120. As illustrated in FIG. 3, if the EMI existed at the joint between the plates of the two piece interface plate 120 and cable bushing 110, it would enter the joint horizontally. The interference would first encounter a portion of the cable bushing 110. At this point, much of the EMI will be reflected away from the interface plate. Any residual EMI will continue to follow vertically along joint between the cable bushing 110 and interface plate 120. However, as shown in FIG. 3, this EMI will encounter the another portion of the cable bushing 110. Any remaining EMI will be reflected and will not pass through the remaining joint area. As a result, EMI is unable to penetrate through the entire joint between the cable bushing and interface plate 120 because there exists at least two perpendicular surfaces interface to reflect the EMI in directions away from the interface.

Figure 4:
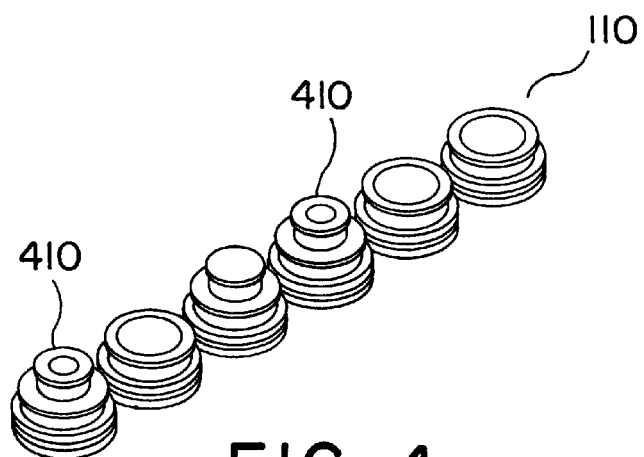
FIG. 4 illustrates bushings used in accordance with an exemplary embodiment of the present invention.

As illustrated in FIG. 4, the cable bushings 110 can be of a standardized size, to fit in the holes of the interface plate. If desired, however, a single cable bushing 110 can be designed to accommodate a wide range of cable bundle diameters. Each cable bushing can contain a cap 410 that can be drilled or punched out to the user's need specification. The parts required by the present invention are common for most electrical cables and can be kept on-hand to reduce lead times. Additionally, the interface plate provides strain relief for wires and contacts by transferring loads to the cable bushing, interface plate, and cable braid.

It will be appreciated by those skilled in the art that the present invention can be embodied in other specific forms without departing from the spirit or essential characteristics thereof. The presently disclosed embodiments are therefore considered in all respects illustrative and not restricted. The scope of the invention is indicated by the appended claims rather than the foregoing description and all changes that come within the meaning and range and equivalence thereof are intended to be embraced within.

What is claimed is:

1. A shielded connector assembly, comprising:
   a cable interface assembly for establishing an electromagnetic interference (EMI) shield for shielding an area, said shield being formed of multiple components assembled together with a joint between the components of the shield, said joint being susceptible to EMI; and
   a connector, electrically shielded by said cable interface assembly, for connecting a conductive wire to an electronic assembly, the components of the cable interface assembly further including:
      at least two interface plates mated at an interface for establishing said joint and at least one opening of said joint being configured to reflect EMI away from the shielded area; and
      at least one cable bushing for receiving said conductive wire, mounted between said interface plates in said at least one opening, wherein an interface between said cable bushing and said mating interface plates comprises at least two perpendicular surfaces to reflect EMI from the shielded area.

2. The cable interface of claim 1, wherein said cable bushing is one of aluminum and metallized plastic.

3. The cable interface of claim 1, wherein said connector is non-metallic.

4. The cable interface of claim 1, wherein the joint between said at least two interface plates further comprises:
   at least two perpendicular surfaces to reflect said EMI away from the shield.

5. The cable interface of claim 2, wherein said at least one conductive wire further includes:
   a braid to protect said at least one conductive wire from EMI interference.

6. The cable interface of claim 4, wherein said joint between said two interface plates is a lap joint.

7. The cable interface of claim 4, wherein said joint between said two interface plates is a tongue-and-groove joint.

8. A cable interface assembly for establishing an electromagnetic interference (EMI) shield for shielding an area, said shield being formed of multiple components assembled together with a joint between the components of the shield, said joint being susceptible to EMI, said cable interface assembly comprising:
   at least two interface plates mated at an interface for establishing said joint and at least one opening of said joint being configured to reflect EMI away from the shielded area; and
   at least one cable bushing for receiving a conductive wire, mounted between said interface plates in said at least one opening, wherein an interface between said cable bushing and said at least two mating plates includes at least two perpendicular surfaces to reflect EMI.

9. The cable interface assembly of claim 8, wherein the interface between said at least two mating plates includes at least two perpendicular surfaces to reflect said EMI.

10. The cable interface assembly of claim 8, wherein said bushing and said mating plates are one of aluminum and metallized plastic.

11. The cable interface assembly of claim 8, wherein said interface between said two interface plates is a lap joint.

12. The cable interface assembly of claim 8, wherein said interface between said two interface plates is a tongue-and-groove joint.

* * * * *